United States Patent [19]

Lee et al.

[11] Patent Number: 4,990,467
[45] Date of Patent: Feb. 5, 1991

[54] METHOD OF PREVENTING RESIDUE ON AN INSULATOR LAYER IN THE FABRICATION OF A SEMICONDUCTOR DEVICE

[75] Inventors: Chuljin Lee, Suwon; Euisong Kim, Anyang, both of Rep. of Korea

[73] Assignee: Samsung Electronics Co., Ltd., Suwon, Rep. of Korea

[21] Appl. No.: 378,660

[22] Filed: Jul. 12, 1989

[30] Foreign Application Priority Data

Aug. 11, 1988 [KR] Rep. of Korea ............... 88-10249

[51] Int. Cl.[5] .......................................... H01L 21/443
[52] U.S. Cl. .................................. 437/192; 437/229; 437/944
[58] Field of Search ............... 437/187, 229, 944, 192; 148/DIG. 100

[56] References Cited

U.S. PATENT DOCUMENTS

| | | | |
|---|---|---|---|
| 3,429,029 | 2/1969 | Langdon | 29/589 |
| 4,532,702 | 8/1985 | Gigante et al. | 29/578 |
| 4,824,802 | 2/1989 | Brown et al. | 437/192 |

FOREIGN PATENT DOCUMENTS

| | | | |
|---|---|---|---|
| 0100735 | 2/1984 | European Pat. Off. | 437/944 |
| 0210372 | 6/1984 | Fed. Rep. of Germany | 437/944 |
| 57-49230 | 3/1982 | Japan | 437/944 |
| 57-92849 | 6/1982 | Japan | 437/944 |

OTHER PUBLICATIONS

"Selective LPCVD Tungsten for Contact Barrier Applications", Levy et al., J. Electrochem., Soc.; Solid State Science and Technology, vol. 133, No. 9, pp. 1905–1912, Sep. 1986.

*Primary Examiner*—Olik Chaudhuri
*Assistant Examiner*—Ourmazd S. Ojan

[57] ABSTRACT

A method for fabrication of semiconductor device in which a tungsten film only exists on contact hole which is comprising the steps of depositing a insulator layer on the silicon substrate being doped by impurity, depositing a photoresist high temperature resistant resin on the insulator layer in order to form a contact hole, forming a contact hole by etching the insulator layer using the photoresist resin as a mask, selectively depositing tungsten film on the contact hole and removing the photoresist layer, and a method for fabrication of semiconductor device which is comprising the steps of depositing the first photoresist resin layer followed by depositing the second photoresist resin layer on the insulator layer forming a pattern to the first and the second photoresist resin layer, forming a contact hole by etching the insulator layer, selectively depositing tungsten film on the contact hole after removing the second photoresist resin layer and removing the first photoresist resin layer.

4 Claims, 3 Drawing Sheets

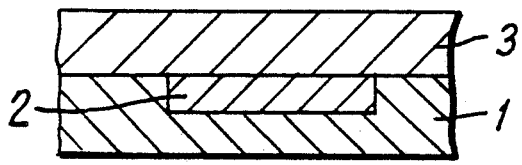
FIG. I(A)
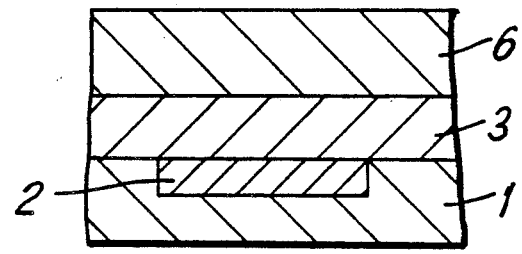
FIG. I(B)
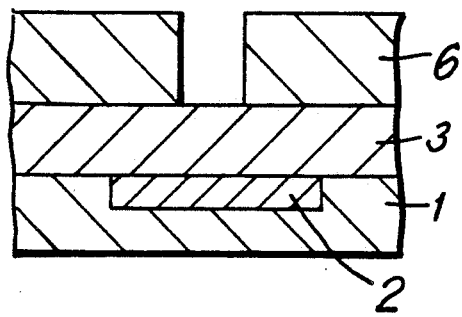
FIG. I(C)
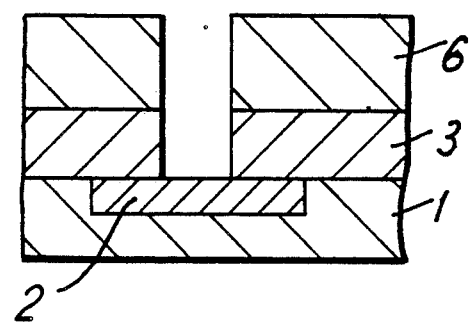
FIG. I(D)
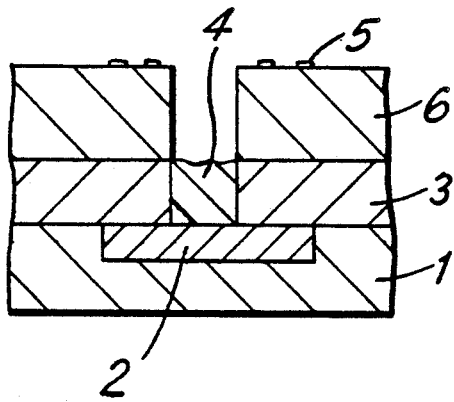
FIG. I(E)
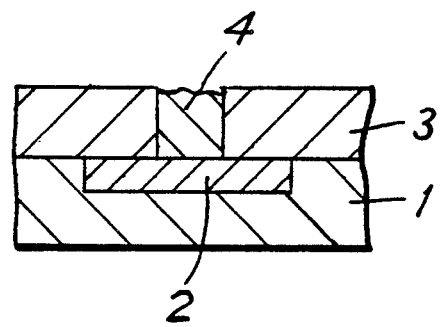
FIG. I(F)

METHOD OF PREVENTING RESIDUE ON AN INSULATOR LAYER IN THE FABRICATION OF A SEMICONDUCTOR DEVICE

BACKGROUND OF THE INVENTION

The present invention relates to method for the fabrication of a semiconductor device and, more particularly to a method for selective deposition of tungsten film into a contact hole by a chemical evaporating method during a process for deposition of metallic circuits on the contact hole.

It is already known that the selective deposition of tungsten film into deep contact hole by a chemical evaporating method during fabricating a metallic circuit is a very useful technique.

However, there are two critical problems in the conventional selective deposition technique of tungsten film which is to be improved.

That is, (1) Tungsten residue 5 remains on the insulator layer 3 because of selective loss between silicon substrate 1 and the insulator layer 3, as shown in FIG. 3.

(2) Leakage current increases due to tunneling caused by enchroachment of electrodes.

In order to remove tungsten residue 5 on the insulator layer 3, it was proposed to clean the surface of the insulator before the deposition of the tungsten film after fabricating a contact hole by a plasma etching method, or to etch back the residue after deposition of the tungsten film.

However, the methods mentioned above are not desirable, because the reproducibility of the process deteriorates if there is cleaning of the surface of the insulator before the deposition of the tungsten film. Moreover, the etchback method overetched inside of the contact hole resulting in water or other chemical substances attacking during the succeeding process as shown in FIG. 4.

BRIEF SUMMARY OF THE INVENTION

Accordingly, it is an object of the present invention to provide a method for the fabrication of a semiconductor device which is able to remove a tungsten film on the insulator layer caused by selectivity loss during a deposition process of the tungsten film after forming a contact hole using high temperature resistant photoresist resin.

It is another object of the present invention to provide a method for fabrication of a semiconductor device which is able to deposit tungsten film a at very small and deep contact hole by forming a contact hole with photoresist resin in two layers followed by deposition of tungsten film thereon.

According to a preferred embodiment of the present invention, there is provided a method for fabrication of the semiconductor device in which a tungsten film only exists in the contact hole which comprises the steps of (1) depositing an insulator layer on the silicon substrate being doped by impurity, (2) depositing a photoresist high temperature resistant resin on the insulator layer in order to form a contact hole, (3) forming a contact hole by etching the insulator layer using the photoresist resin as a mask, (4) selectively depositing tungsten film in the contact hole and (5) removing the photoresist layer.

According to an another embodiment of the present invention, there is provided a method for fabrication of the semiconductor device which comprises the steps of (1) depositing the first photoresist resin layer followed by depositing the second photoresist resin layer on the isulator layer (2) forming a pattern to the first and the second photoresist resin layer, (3) forming a contact hole by etching the insulator layer, (4) selectively depositing tungsten film on the contact hole after removing the second photoresist resin layer and (5) removing the first photoresist resin layer.

The above and other related objects and features of the present invention will be apparent from the reading of the following description of the disclosure found in the accompanying drawings and the novelty thereof pointed out in the appended claims.

BRIEF DESCRIPTION OF THE DRAWINGS

FIG. 1(A), FIG. 1(B), FIG. 1(C), FIG. 1(D), FIG. 1(E), and FIG. 1(F) show a diagrammatic illustration of fabricating a semiconductor device in accordance with the first embodiment of the present invention.

DETAILED DESCRIPTION OF THE INVENTION

Figure 2A:
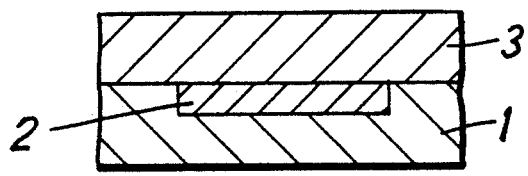
FIG. 2(A), FIG. 2(B), FIG. 2(C), FIG. 2(D), FIG. 2(E), FIG. 2(F), FIG. 2(G) and FIG. 2(H) show a diagrammatic illustration of fabricating a semiconductor device in accordance with the second embodiment of the present invention.

Now, the present invention will be described in more detail referring to the drawing wherein like reference characters designate corresponding parts throughout the several views.

FIG. 1 shows the first embodiment of the present invention which is a selective deposition method of tungsten into a contact hole using high temperature resistant photoresist resin. Firstly, FIG. 1(A) shows that an impurity doped region 2 was made on silicon substrate 1 followed by deposition of insulator layer 3. In this process, LTO or BPSG film may be used for insulator layer (3), and the thickness thereof may be 1 Tfm. Then, high temperature resistant photoresist resin (6) was deposited onto the insulator layer (3) as shown in FIG. 1(B). In this process, polyimide or PMGI may be used for the photoresist resin with 1.5 Tfm thickness. Polyimide and PMGI are resistible for temperatures up to 600 TxC and 350 TxC respectively.

Figure 3:
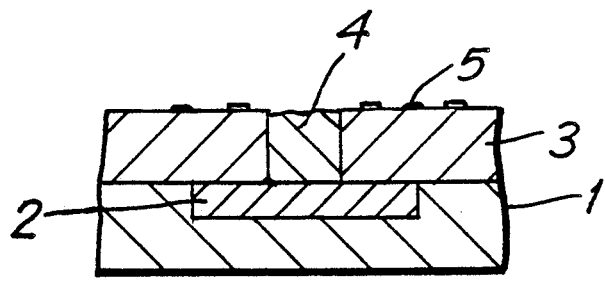
FIG. 3 is sectional view of a conventional semiconductor device to which a tungsten film is deposited selectively by a chemical evaporating method on the contact hole.
Figure 4:
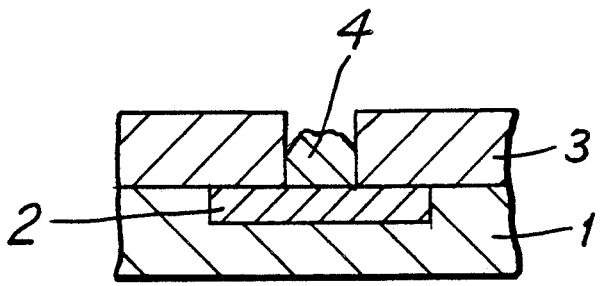
FIG. 4 is a sectional view of a conventional semiconductor device after plasma etching back in order to remove the tungsten film on the insulator layer caused by selectivity loss after selective deposition of the tungsten film in the contact hole.

Patterning to the photoresist resin 6 by photolithography after depositing of the photoresist resin followed by etching of the insulator layer (3) using RIE dry etching method, the contact hole may by formed as shown in FIG. 1(D). If tungsten film is deposited selectively in the contact hole, the tungsten film (4) is deposited inside the contact hole and the residue (5) can be left on the photoresist resin (6) (see FIG. 3(E)). When the tungsten film (4) is deposited selectively and then the photoresist resin (6) is removed by a wet or dry etching method, there will not be left residue on the insulator layer (3) and the tungsten film will be left only inside the contact hole. Thus, the tungsten remains only within the contact hole without leaving the residue. The reaction pressure is 400 mTorr at depositing and there is used SiH4/WF6 gas at 273TxC and WF6/H2 gas at 550TxC. There is used polyimid and PMGI (Poly Methyl Glutar Imide) for the reaction temperature of 550 TxC and 273 TxC respectively.

FIG. 2 shows the second processing method of this invention which refers to a method wherein delicate contact hole can be exactly fabricated even on a rough surface by depositing film in the contact hole by forming a two layered photoresist resin.

It is as seen in FIG. 2(A) that the insulator layer (3) was deposited onto impurity doped region (2) within silicon substrate (1).

Figure 2B:
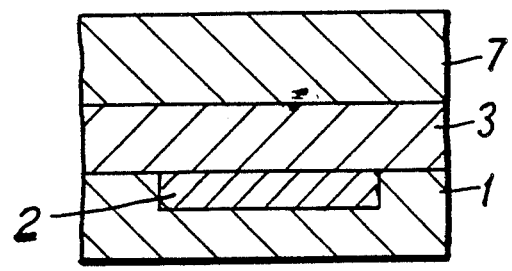
Figure 2C:
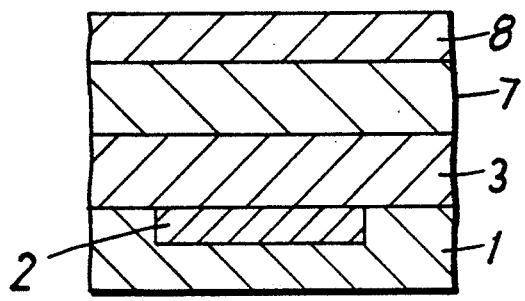
Figure 2D:
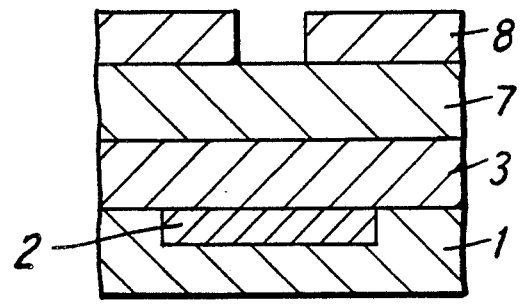
Figure 2E:
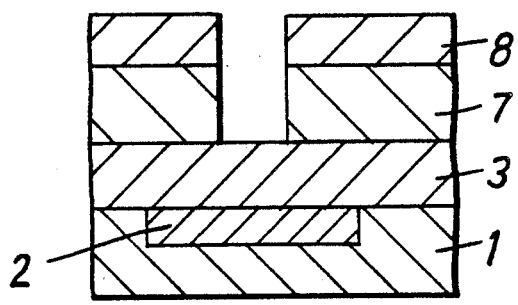

FIG. 2(B) shows the first coating (7) of 1.5 Tfm thick is polyimid or PMGI (Poly Methyl Glutar Imide) and FIG. 2(C) shows the second coating (8) is positive photoresist of 0.4 Tfm thick. After patterning to the second photoresist resin by photolithographic or wet etching as shown in FIG. 2(D), there is patterned to the first photoresist resin(7) by RIE dry etching using the second photoresist resin(8) as a mask, as shown in FIG. 2(E).

Figure 2F:
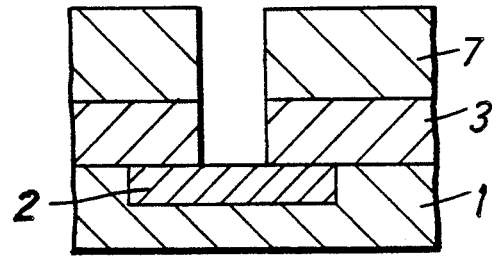
Figure 2G:
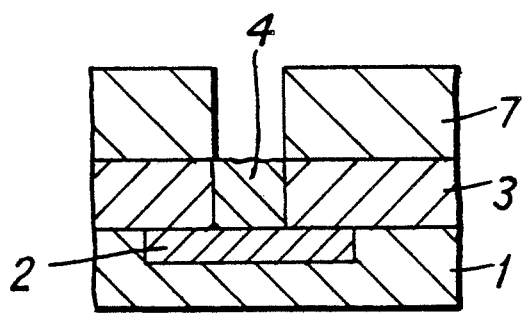
Figure 2H:
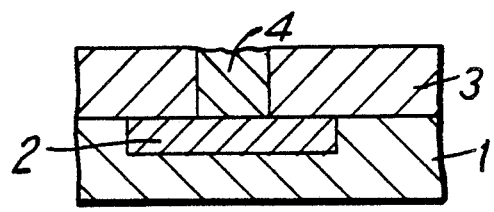

The insulater(3) is etched away to create a contact hole followed by removing the second photoresist(8) (see FIG. 2(F)). Selective deposition of tungsten film(4) into the contact hole after removing the photoresist(7) results in the deposition of tungsten film only within the contact hole.

This invention uses high temperature resistant photoresist resin to prevent residue on the insulator layer because of selectivity loss.

Another advantage is that the cleaning process for the removal of the residue is not required for promoting the ratio of selectivity.

Two layered photoresist is very useful to make a delicate contact hole on rough surface of the silicon and deposit tungsten film inside the contact hole.

While the present invention has been particularly shown and described with reference to preferred embodiments thereof, it should be understood that various modifications, variations and other changes may be made by those skilled in the art without departing from the spirit of the invention.

The scope of the invention is therefore to be determined solely by the appended claims.

What is claimed is:

1. A method for the fabrication of a semiconductor device comprising the steps of doping of impurity on a substrate to form an impurity doped region on said substrate, depositing an insulator layer on said substrate, depositing a photoresist resin on said insulator layer in order to form a contact hole, said contact hole being formed by etching the insulator layer using the photoresist resin as a mask, selectively depositing a tungsten film in said contact hole so that the tungsten film is located only inside said contact hole, and removing the photoresist resin after selectively depositing the tungsten film in said contact hole to simultaneously remove tungsten residue deposited on the photoresist resin so that tungsten film is deposited only inside said contact hole.

2. A method according to claim 1, further comprising depositing a second photoresist resin on said insulator layer consecutively to the first said photoresist resin, forming a pattern to said second photoresist resin by etching said second photoresist resin in a photoetching process, forming a pattern to the first said photoresist resin using said second photoresist resin as a mask, removing said second photoresist resin prior to said contact hole being formed, and removing the first said photoresist resin so that the tungsten film is deposited only inside said contact hole.

3. A method according to claim 2, wherein said second photoresist resin comprises a positive photoresist, and the first said photoresist resin comprises high temperature resistant polyimide or PMGI.

4. A method according to claim 2, wherein the pattern is formed to the first said and second photoresist resins by RIE dry etching of the first said photoresist resin and wet etching of said second photoresist resin.

* * * * *